United States Patent [19]

Westwater et al.

[11] Patent Number: 5,858,862
[45] Date of Patent: Jan. 12, 1999

[54] PROCESS FOR PRODUCING QUANTUM FINE WIRE

[75] Inventors: Jonathan Westwater; Dharam Pal Gosain; Miyako Nakagoe; Setsuo Usui, all of Kanagawa, Japan

[73] Assignee: Sony Corporation, Tokyo, Japan

[21] Appl. No.: 822,758

[22] Filed: Mar. 24, 1997

[30] Foreign Application Priority Data

Sep. 25, 1996 [JP] Japan .................................. 8-274014

[51] Int. Cl.⁶ .................................................. C30B 23/00
[52] U.S. Cl. .................................. 438/503; 117/12; 257/3
[58] Field of Search .............................. 438/503; 117/12; 257/3

[56] References Cited

U.S. PATENT DOCUMENTS 5,381,753  1/1995  Okajima et al. ........................ 117/12

OTHER PUBLICATIONS

Jensen et al., "Thermal Chemical Vapor Deposition," in Thin Film Processes II, edited by Vossen et al., Academic Press, p. 333 (no month given), 1991.

*Primary Examiner*—Charles Bowers
*Assistant Examiner*—Keith Christianson
*Attorney, Agent, or Firm*—Hill & Simpson

[57] ABSTRACT

A process of producing quantum fine wires, it is called silicon nanowires, too, which allows silicon quantum fine wires to grow into desirable shapes. In this process, gold is deposited on a silicon substrate to a thickness of 5 nm or less, and the silicon substrate is heated at a temperature of 450° C. to 650° C. in an atmosphere containing silane gas at a pressure less than 0.5 Torr, whereby drops of a molten alloy of silicon and gold are formed on the surface of the silicon substrate and the silane gas is decomposed by the action of the molten alloy drops as catalyst, to allow silicon quantum fine wires to grow into such desirable shapes as to be uniform in diameter without any bending.

4 Claims, 4 Drawing Sheets

FIG. IA
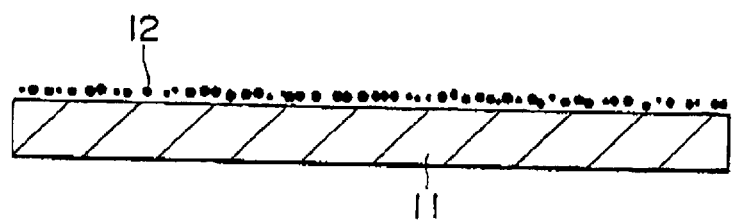
FIG. IB
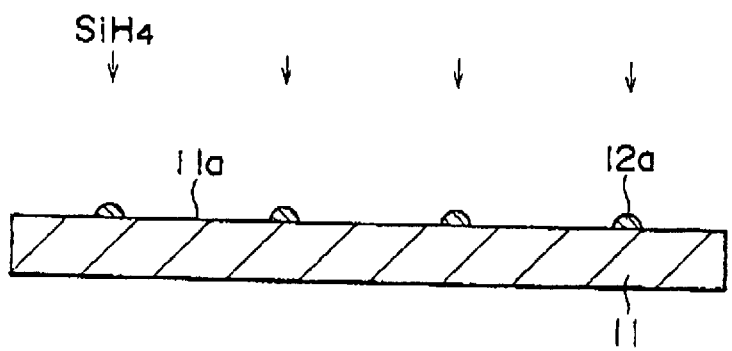
FIG. IC
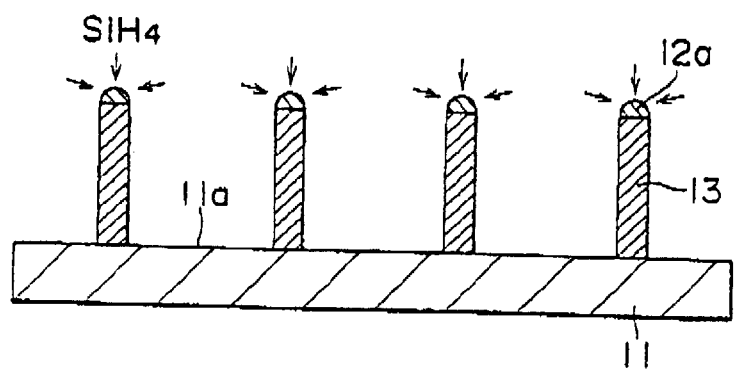

PROCESS FOR PRODUCING QUANTUM FINE WIRE

BACKGROUND OF THE INVENTION

The present invention relates to a process for producing quantum fine wires, it is called silicon nanowires, too, and particularly to a process of allowing silicon quantum fine wires to grow on the surface of a silicon substrate at a lower temperature.

A material in the form of quantum fine wires can exhibit new physical properties different from the physical properties inherent to the same material in the bulk form by the nanometer size effect. For example, as shown in FIG. 4, for a silicon (Si) quantum fine wire, the band gap increases with a decrease in diameter. Also, the material in the form of quantum fine wires has a direct transition type band gap, although the same material in the bulk form has an indirect transition type band gap. Consequently, in the silicon quantum fine wires, the re-combination luminous efficiency of excited electrons-positive holes significantly increases, and the luminous wavelength is shifted on the short-wavelength side, which enables emission of visible light.

The silicon quantum fine wires exhibiting these physical properties have been produced by a process of etching a silicon substrate using electron beam lithography or the like. Such a process, however, has a difficulty in production of silicon quantum fine wires, having a uniform distribution of shapes over a wide region, at a high integration.

To solve this problem, there has been proposed a technique in which a large number of silicon quantum fine wires are allowed to grow on a silicon substrate using a VLS (Vapor-Liquid-Solid) process (E. L. Givargizov: J. Vac. Sci. Techno. B11 (2), p449). This technique involves vapor-depositing gold on a silicon substrate and forming drops of a molten alloy of silicon and gold on the surface of the silicon substrate, and heating the silicon substrate while supplying silicon chloride ($SiCl_4$) gas diluted with hydrogen ($H_2$) gas as a silicon source gas, whereby allowing the growth of silicon quantum fine wires [Wagner et al.: Appl. Phys. Lett. 4, No. 5, 89 (1964); and Givargizov: J. Cryst. Growth, 31, 20 (1975)].

In the above technique, silicon chloride gas reacts with hydrogen gas, to produce silicon by a thermal decomposition expressed in a chemical equation (1).

$$SiCl_4 + 2H_2 \rightarrow Si + 4HCl \qquad (1)$$

The above thermal decomposition is accelerated by the catalytic action of gold on the surfaces of the molten alloy drops formed on the silicon substrate. The silicon thus produced is diffused in the molten alloy drops in a liquid state, and is bonded to solid silicon at the liquid-solid interface. Thus, silicon quantum fine wires grow on the surface of the silicon substrate.

The above related art technique, however, has a problem. Namely, in this technique, the reaction allowing the growth of silicon quantum fine wires must be performed at a temperature being as high as 1000° C. At such a high temperature, silicon chloride is possibly decomposed, though being in a slight amount, on a surface portion of the silicon substrate on which the molten alloy drops are not formed, with a result that each of the silicon quantum fine wires would be formed in a cone shape with a thick root portion. The silicon quantum fine wires such cone shapes cannot exhibit the uniform quantum confinement effect over the entire silicon quantum fine wires.

SUMMARY OF THE INVENTION

An object of the present invention is to provide a process of producing quantum fine wires, which allows silicon quantum fine wires to grow on a silicon substrate by heating the silicon substrate at a temperature lower than that adopted in the related art process.

To achieve the above object, according to the present invention, there is provided a process of producing quantum fine wires, including the steps of: vapor-depositing gold on a silicon substrate; and heating the silicon substrate deposited with the gold in an atmosphere containing at least one kind of gas selected from a group consisting of silane gas, disilane gas and trisilane gas.

In the above process, fine particles of gold vapor-deposited on the silicon substrate are aggregated, to form drops of a molten alloy of silicon and gold. The decomposition of silane gas is selectively generated on the molten alloy drops, to allow silicon quantum fine wires to grow on tho silicon substrate.

BRIEF DESCRIPTION OF THE DRAWINGS

FIGS. 1A to 1C are sectional views of a silicon substrate illustrating steps of producing quantum fine wires on the silicon substrate according to one embodiment of the present invention;

DETAILED DESCRIPTION OF THE PREFERRED EMBODIMENT

Figure 2:
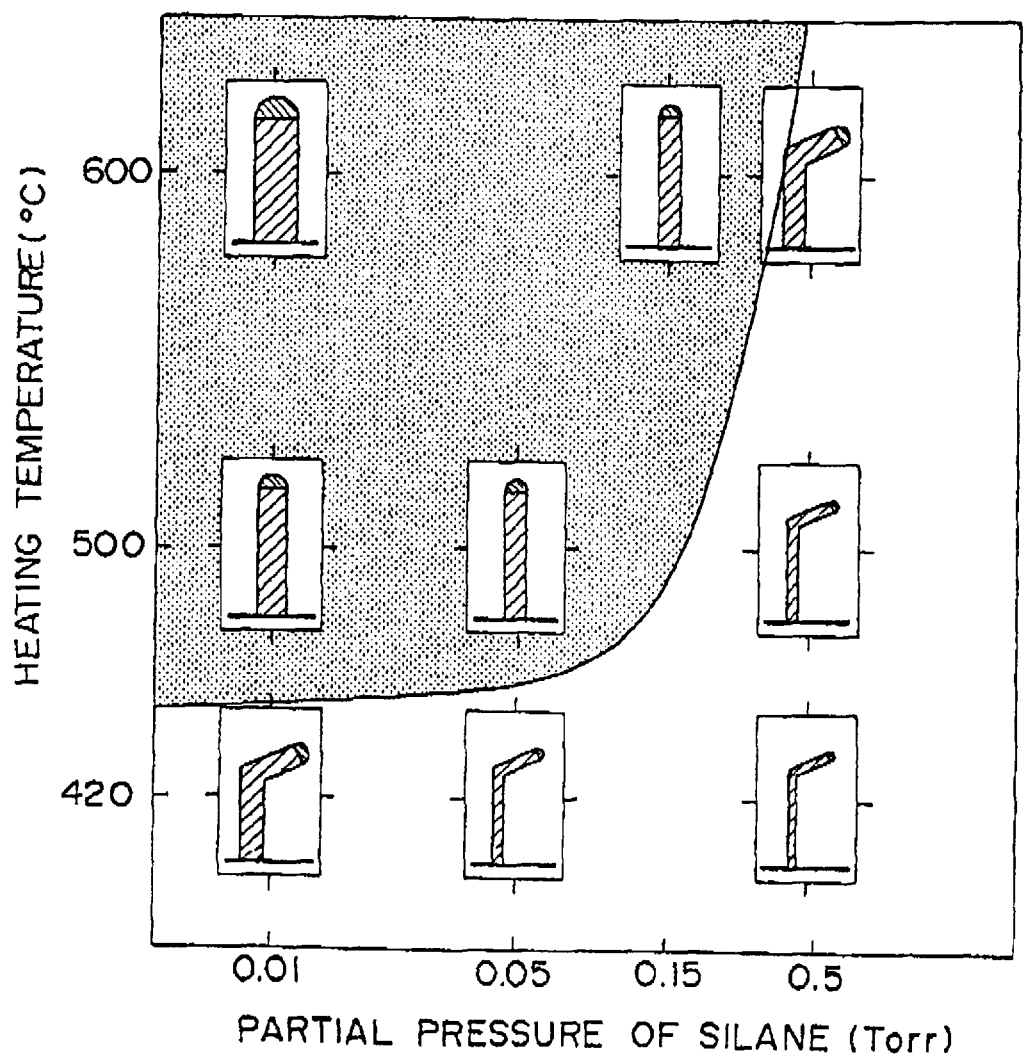
FIG. 2 is a graph showing SEM observation results of silicon quantum fine wires allowed to grow under conditions that the pressure of silane gas and the heating temperature are changed according to the embodiment of the present invention.

Hereinafter, one embodiment of the present invention will be described with reference to the accompanying drawings.

FIGS. 1A to 1C show a process of producing quantum fine wires in accordance with the embodiment of the present invention. In this embodiment, while not shown, a silicon substrate 11 is cleaned to remove natural oxide adhering on the surface.

The silicon substrate 11 is put in a reaction chamber (not shown), and as shown in FIG. 1A, gold 12 is vapor-deposited on the surface of the silicon substrate 11 under a reduced pressure. The thickness of a film of the gold 12 thus deposited is preferably in a range of 5 nm or less. This is intended to make smaller the sizes of drops 12a of a molten alloy to be formed in the next step which will be described later.

Subsequently, silane ($SiH_4$) gas diluted with helium (He) gas is introduced in the reaction chamber (not shown), and the pressure of the silane gas is adjusted at a value less than 0.5 Torr, preferably, less than 0.15 Torr. In such a state, the silicon substrate 11 is heated to a temperature of 450° C. or more, preferably, in a range of 450° C. to 650° C.

Thus, as shown in FIG. 1B, fine particles of the gold 12 on the surface of the silicon substrate 11 are aggregated, to form drops 12a of a molten alloy of silicon and gold on the surface of the silicon substrate 11. The molten alloy drops 12a act as catalyst for decomposition of the silane gas, which is expressed by a chemical equation (2), so that the silane gas is selectively decomposed at the molten alloy drops 12a. In other words, the silane gas is not decomposed on a surface portion 11a of the silicon substrate 11 on which the molten alloy drops 12a are not formed.

$$SiH_4 \rightarrow Si + 2H_2 \quad (2)$$

Silicon produced by decomposition of the silane gas is diffused in the molten alloy drops 12a and epitaxially bonded to the silicon substrate at the interface between the molten alloy drops 12a and the silicon substrate 11. Thus, as shown in FIG. 1C, silicon quantum fine wires 13 grow on the silicon substrate 11. In addition, the diameter of each quantum fine wire 13 is dependent on the diameter of each molten alloy drop 12a.

In the process of producing quantum fine wires according to this embodiment, as described above, after vapor-deposition of the gold 12 on the silicon substrate 11, the silicon substrate 11 is heated at a temperature of 450° C. or more (preferably, less than 650°C.) in an atmosphere containing silane gas at a pressure of less than 0.5 Torr, and accordingly, the silicon quantum fine wires 14 are allowed to grow into shapes being uniform in diameter. As a result, it is possible to obtain a uniform quantum confinement effect over the entire silicon quantum fine wires 13.

Also, according to the process of producing quantum fine wires, since the film of the gold 12 is vapor-deposited to a thickness of less than 5 nm or less, it is possible to make smaller the sizes of the molten alloy drops 12a, and hence to allow the growth of the silicon quantum fine wires of sufficiently smaller diameters.

The present invention will be more clearly understood with reference to the following example on the basis of the drawings.

EXAMPLE

A polished n-type silicon wafer [(111) face, $\rho = 0.4$ $\Omega$-cm] was prepared, from which a rectangular silicon substrate 11 (1 cm×5 cm) was cut off. The silicon substrate 11 was cleaned in acetone, and etched using a mixed solution of nitric acid ($HNO_3$) and hydrofluoric acid (HF) to remove natural oxide adhering on the surface thereof.

Next, the silicon substrate 11 was put in a reaction chamber (not shown), and the interior of the reaction chamber was evacuated to $5 \times 10^{-8}$ Torr. After that, gold 12 was vapor-deposited on the surface of the silicon substrate using a tungsten (W) filament (see FIG. 1A). At this time, a film of the gold 12 was 0.6 nm.

Subsequently, silane gas diluted with helium gas into a concentration of 10% was introduced in the reaction chamber, and at the same time the silicon substrate 11 was heated, to allow silicon quantum fine wires 13 to grow (see FIGS. 1B and 1C). At this time, the flow rate of the mixed gas was set at 40 sccm, and the partial pressure of the silane gas was changed in a range of 0.01 to 1 Torr. The heating was carried out by allowing a direct current to flow along the major axis of the silicon substrate 11, and the heating temperature was changed in a range of 320° C. to 650° C. In addition, the temperature of the silicon substrate 11 was measured using an optical high temperature sensor and thermocouples.

The silicon quantum fine wires thus produced were observed by a scanning electron microscope (SEM). The results are shown in FIG. 2. In this figure, there are shown the shapes and diameters of the silicon quantum fine wires 13 changed depending on the pressure of the silane gas and the heating temperature.

Figure 3:
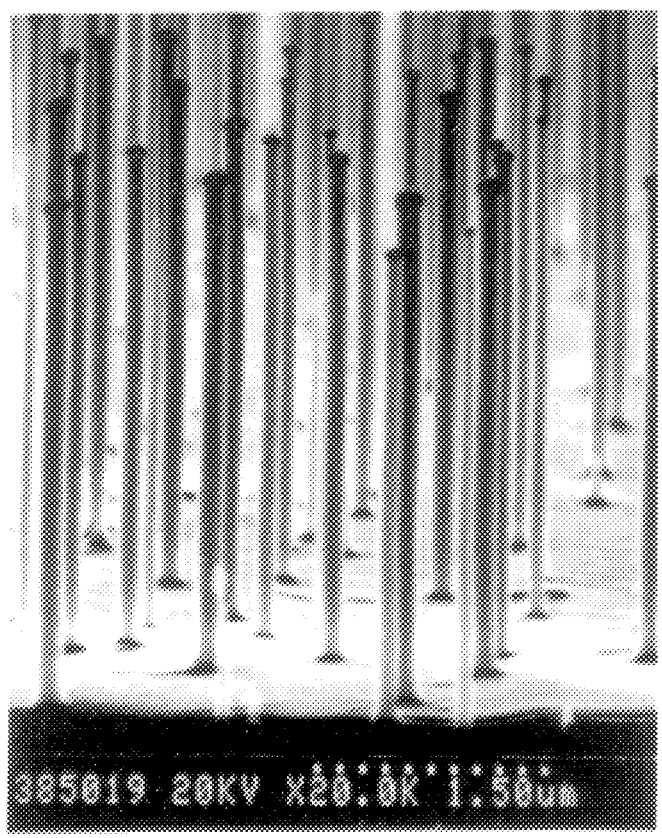
FIG. 3 is a SEM photograph of the silicon quantum fine wires allowed to grow according to the embodiment of the present invention.
Figure 4:
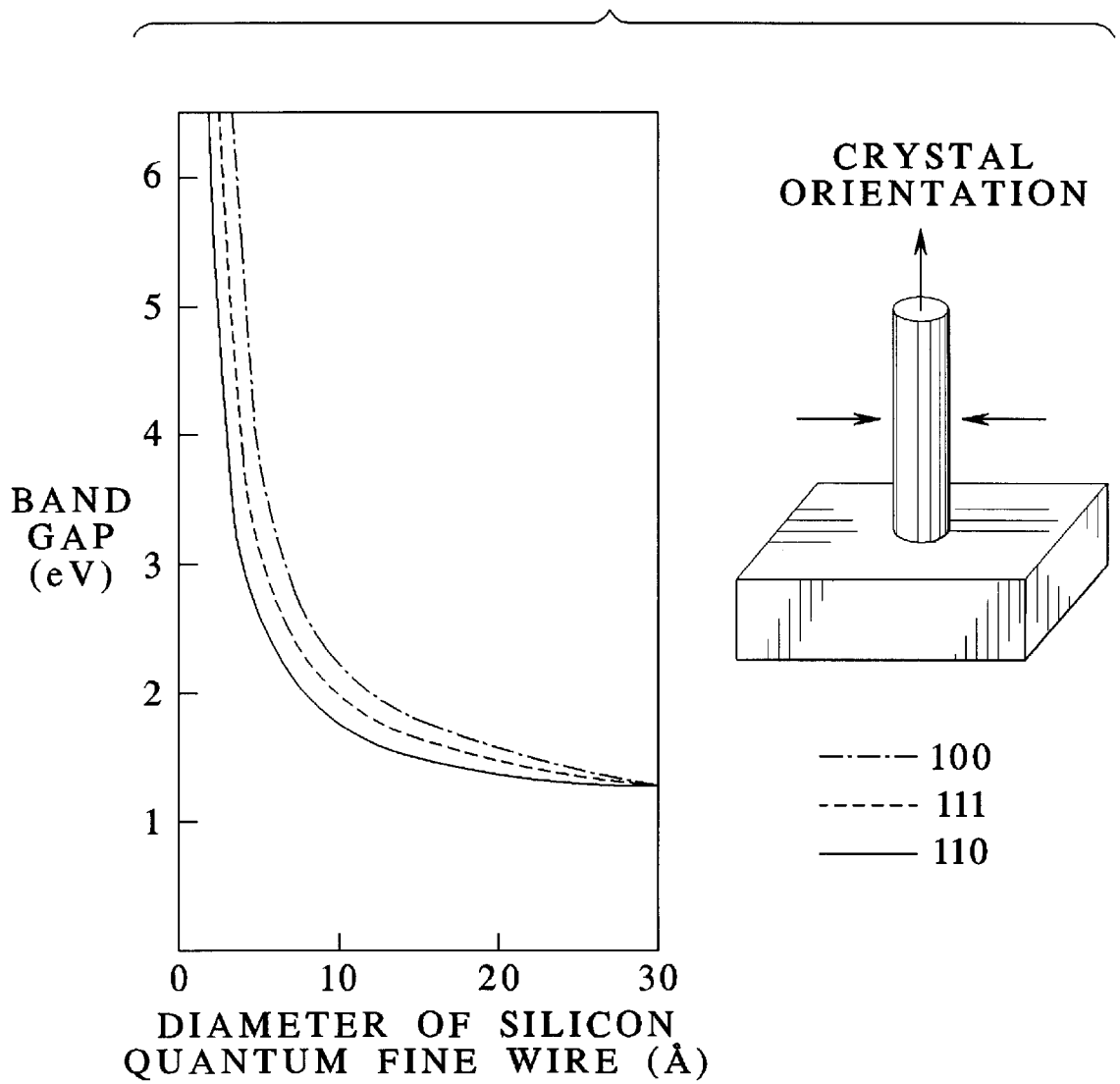
FIG. 4 is a graph showing a relationship between the diameter of a silicon quantum fine wire and the band gap thereof.

As can be seen from FIG. 2, with respect to the silicon quantum fine wires allowed to grow in the conditions pertaining to a nucleation range shown in the figure (that is, heating temperature: about 450° C. or more; partial pressure of silane gas: less than 0.5 Torr), it was observed that they grew in such desirable shapes as to be perpendicular to the silicon substrate 11 without any bending. FIG. 3 is a SEM photograph of the silicon quantum fine wires allowed to grow, for example, for one hour at a heating temperature of 520° C. and at a partial pressure of silane gas of 0.01 Torr. This photograph was taken from the upper, oblique side of the silicon substrate 11. From this photograph, there can be observed the silicon quantum fine wires 13, each having a diameter of about 40 nm, allowed to grow into such shapes as to be perpendicular to the silicon substrate 11.

On the contrary, with respect to the silicon quantum fine wires 13 allowed to grow in the conditions pertaining to a non-nucleation range, it was observed that they grew in such undesirable shapes as to be bent.

In this way, the bending of the silicon quantum fine wires 13 tends to be generated in the range that the pressure of the silane gas is higher and the heating temperature is lower. When the pressure of the silane gas becomes higher, the amount of silicon diffused in the molten alloy drops 12a per unit time increases (see FIG. 1B) and thereby the growing rate of the silicon quantum silicon fine wires 13 becomes faster. The bending of the silicon quantum fine wires 13 may be considered to be due to the instability of the liquid-solid interface, and from this viewpoint, it may be considered that the increased growing rate would make unstable the liquid-solid interface, to result in the bending of the silicon quantum fine wires.

As shown in FIG. 2, it was also observed that the diameters of the silicon quantum fine wires 13 are liable to become thinner as the pressure of the silane gas becomes higher. This is supported by the following theory.

The diameters of the silicon quantum fine wires 13 are dependent on the diameters of the molten alloy drops 12a formed on the surface of the silicon substrate 11. The molten alloy drops 12a are formed by heating of the gold 12 vapor-deposited on the surface of the silicon substrate 11, and in some cases, several small-sized drops are possibly aggregated into a large-sized drop.

Further, the minimum value of the diameters of the silicon quantum fine wires 13 allowed to grow under a given condition in the VLS reaction is specified by the Gibbs-Thomson's equation (3).

$$\Delta\mu\text{wire} = \Delta\mu\text{bulk} - 4\Omega\alpha/d$$

$$\Delta\mu\text{wire} = \mu\text{vapor} - \mu\text{wire}$$

$$\Delta\mu\text{bulk} = \mu\text{vapor} - \mu\text{bulk}$$

where $\mu$wire, $\mu$bulk, and $\mu$vapor indicate effective chemical potentials of fine wire phase, bulk phase, vapor phase of silicon, respectively; d is a diameter of the silicon quantum fine wire 13; $\alpha$ is a free energy on the surface of the silicon quantum fine wire 13; and $\Omega$ is the atomic volume of silicon.

As can be seen from the above equation, in the case where the molten alloy drop is very small in size, the silicon quantum fine is not allowed to grown. The reason for this is that since the ratio of the surface area of the silicon quantum fine wire 13 to the volume thereof is high, the effective chemical potential of the fine wire phase becomes higher than that of the vapor phase. In the case where small-sized drops are aggregated to a large-size drop having a critical diameter or more, the silicon quantum fine wire 13 is allowed to grow on the silicon substrate at the position of the drop.

Thus, as the pressure of silane gas becomes higher, the value of $\mu$vapor becomes larger and thereby the value of $\Delta\mu$bulk becomes larger, so that the diameter of the silicon quantum fine wire 13 becomes thin. This agrees with the result shown in FIG. 2.

Although the preferred embodiment has been described with reference to the example, such description is for illustrative purposes only, and it is to be understood that many changes may be made without departing from the scope of the present invention. For example, in the embodiment described with reference to the example, after the gold 12 is vapor-deposited on the silicon substrate 11, the silicon substrate 11 is heated in an atmosphere containing silane gas to form the molten alloy drops 12a; however, after the gold 12 is vapor-deposited on the silicon substrate 11, the silicon substrate 11 may be heated before introduction of silane gas to form the molten alloy drops 12a, or the gold 12 may be vapor-deposited on the silicon substrate 11 while heating the silicon substrate 11 to form the molten alloy drops 12a along with the vapor-deposition of the gold 12.

Although in the embodiment with reference to the example, silane gas is diluted with helium gas before being introduced in a reaction chamber, it may be diluted with another inert gas such as argon gas, or silane gas not diluted may be introduced.

Also, silane gas used as a silicon source gas in the embodiment described with reference to the example may be replaced with disilane ($Si_2H_6$) gas, trisilane ($Si_3H_8$) gas, or a mixed gas of at least two or more kinds of silane gas, disilane gas and trisilane gas. Even in the case of using the above silicon source gas other than silane gas, the silicon quantum fine wires are allowed to grow in the same condition as in the case of using silane gas.

As described above, according to the present invention, since after gold is vapor-deposited on a silicon substrate, the silicon substrate is heated in an atmosphere containing at least one kind of gas selected from a group consisting of silane gas, disilane gas and trisilane gas, it is possible to allow silicon quantum fine wires to grow at a temperature lower than that in the related art process. Also, when the above silicon substrate on which the gold is vapor-deposited is heated at a temperature of 450° C. or more in an atmosphere containing the above gas at a pressure of less than 0.5 Torr, it is possible to allow silicon quantum fine wires to grow into such desirable shapes as to be uniform in diameter.

What is claimed is:

1. A process of producing straight quantum fine wires, the process comprising:

a first step of vapor-depositing gold on a silicon substrate; and a second step of heating said silicon substrate vapor-deposited with said gold in an atmosphere containing at least a gas selected from a group consisting of silane gas, disilane gas, trisilane gas, and mixtures thereof, the pressure of said gas is less than 0.5 Torr and said heating is performed at a temperature of 450° C. or more.

2. A process of producing straight quantum fine wires according to claim 1, wherein said heating is performed at a temperature in a range of 450° C. to 650° C.

3. A process of producing straight quantum fine wires according to claim 1, wherein the thickness of a film of said gold vapor-deposited in said first step is 5 nm or less.

4. A process of producing straight quantum fine wires, comprising:

a first step of vapor-depositing gold on a silicon substrate to a thickness of 5 nm or less; and a second step of heating said silicon substrate vapor-deposited with said gold at a temperature of 450° C. to 650° C. in an atmosphere containing silane gas at a pressure of less than 0.5 Torr.

* * * * *